(12) United States Patent
Compen et al.

(10) Patent No.: US 7,978,308 B2
(45) Date of Patent: Jul. 12, 2011

(54) LITHOGRAPHIC APPARATUS AND DEVICE MANUFACTURING METHOD

(75) Inventors: Rene Theodorus Petrus Compen, Valkenswaard (NL); Oleg Voznyi, Eindhoven (NL); Martijn Houben, 's-Hertogenbosch (NL); Majid El Bouchaibi, Veldhoven (NL); Franciscus Johannes Maria Boekholt, Eindhoven (NL); Remko Wakker, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 231 days.

(21) Appl. No.: 11/433,760

(22) Filed: May 15, 2006

(65) Prior Publication Data
US 2007/0263200 A1    Nov. 15, 2007

(51) Int. Cl.
G03B 27/58    (2006.01)
G03B 27/60    (2006.01)

(52) U.S. Cl. ............................................ 355/72; 355/73
(58) Field of Classification Search .................. 355/53, 355/72, 75, 73
See application file for complete search history.

(56) References Cited

U.S. PATENT DOCUMENTS

| | | | | |
|---|---|---|---|---|
| 4,775,877 A | * | 10/1988 | Kosugi et al. | 355/53 |
| 5,471,279 A | * | 11/1995 | Takizawa | 355/73 |
| 6,184,972 B1 | * | 2/2001 | Mizutani et al. | 355/72 |
| 6,545,284 B1 | * | 4/2003 | Masuyuki | 250/559.3 |
| 7,113,262 B2 | | 9/2006 | Van Empel et al. | 355/72 |
| 2001/0019401 A1 | * | 9/2001 | Irie et al. | 355/53 |
| 2001/0033369 A1 | * | 10/2001 | Matsui | 355/53 |
| 2004/0223127 A1 | * | 11/2004 | Neerhof | 355/30 |
| 2006/0139614 A1 | * | 6/2006 | Owa et al. | 355/72 |
| 2006/0187432 A1 | * | 8/2006 | Yasuda et al. | 355/53 |

FOREIGN PATENT DOCUMENTS

| | | |
|---|---|---|
| JP | 08-181057 | 7/1996 |
| JP | 11-121362 | 4/1999 |
| JP | 2003-068600 | 3/2003 |
| JP | 2003-197725 | 7/2003 |
| JP | 2003-332411 | 11/2003 |
| JP | 2004-006706 | 1/2004 |
| JP | 2004-221323 | 5/2004 |
| JP | 2005-019993 | 1/2005 |
| JP | 2006-080357 | 3/2006 |
| WO | WO 99/028957 | 6/1999 |

OTHER PUBLICATIONS

Office Action as issued for Japanese Patent Application No. 2007-123107, dated May 25, 2010.

* cited by examiner

Primary Examiner — Hung Henry Nguyen
Assistant Examiner — Steven H Whitesell-Gordon
(74) Attorney, Agent, or Firm — Pillsbury Winthrop Shaw Pittman LLP

(57) ABSTRACT

A lithographic apparatus arranged to transfer a pattern from a patterning device onto a substrate is disclosed, the apparatus including a substrate table constructed to hold a substrate, a first clamping system configured to clamp the substrate table to a substrate table support structure, and a second clamping system configured to clamp a substrate to the substrate table after the substrate table has been clamped to the substrate table support structure.

23 Claims, 5 Drawing Sheets

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a known apparatus, a substrate can be held on a substrate table, the substrate table being supported on a suitable support structure (a chuck). For example, both the substrate and the substrate table are clamped to the chuck at the same time and the substrate table is continuously clamped to the chuck during the processing of substrates.

SUMMARY

It is desirable, for example, to improve a lithographic apparatus and method, particularly to make one or more devices having very small features with improved precision.

In an embodiment, there is provided a lithographic apparatus arranged to transfer a pattern from a patterning device onto a substrate, wherein the apparatus comprises a support configured to hold a patterning device, the patterning device configured to provide a pattern to be transferred onto a substrate, a substrate table constructed to hold a substrate, a first clamping system configured to clamp the substrate table to a substrate table support structure and a second clamping system configured to clamp a substrate to the substrate table after the substrate table has been clamped to the substrate table support structure.

Also, in an embodiment, there is provided a device manufacturing method, comprising clamping a substrate table to a support structure prior to clamping a substrate to the substrate table and transferring a pattern from a patterning device onto the substrate.

In an embodiment, there is provided a substrate table clamping apparatus, comprising a substrate table constructed to hold a substrate; a first clamping system configured to clamp the substrate table to a substrate table support structure; and a second clamping system configured to clamp a substrate to the substrate table after the substrate table has been clamped to the substrate table support structure.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
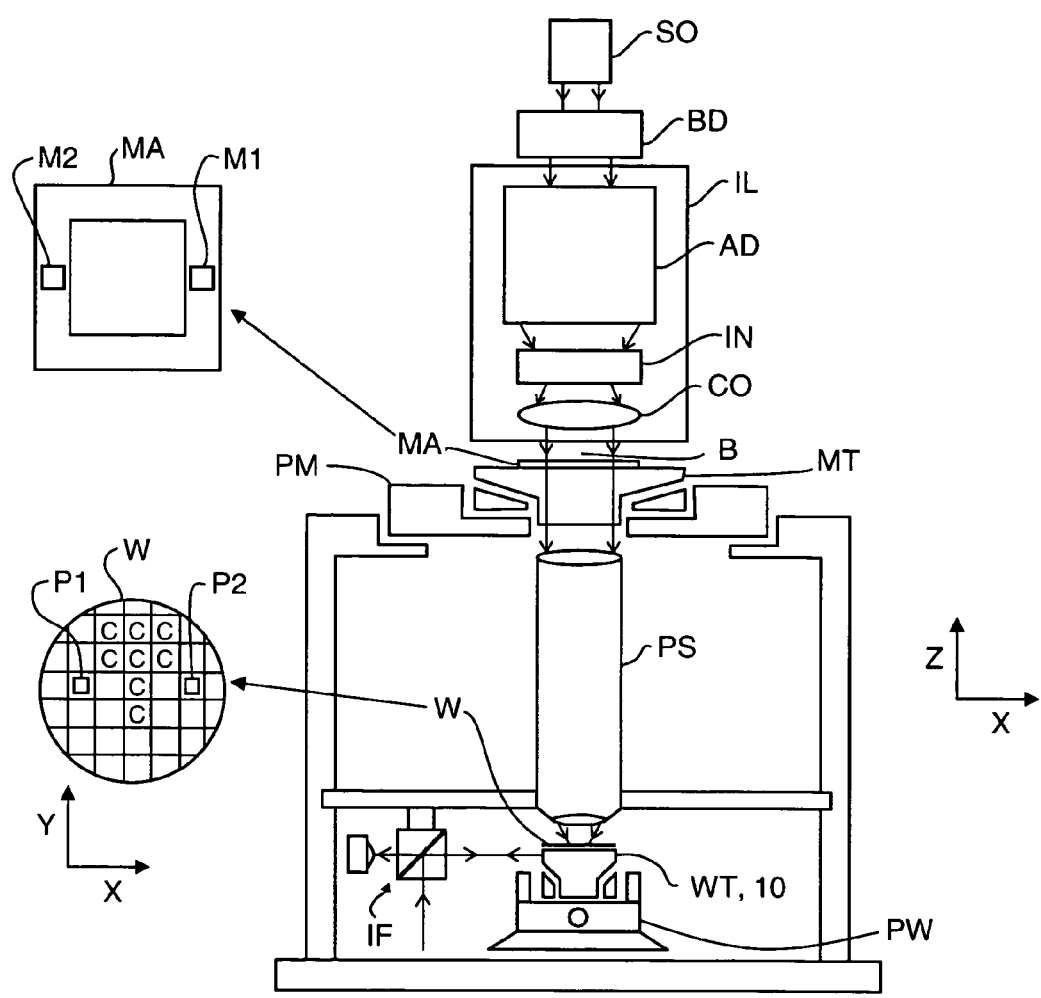
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or other types of radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table or burl table) WT constructed to hold a substrate (e.g. a resist-coated wafer) W, wherein the substrate table WT can be connected or clamped to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate.

It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
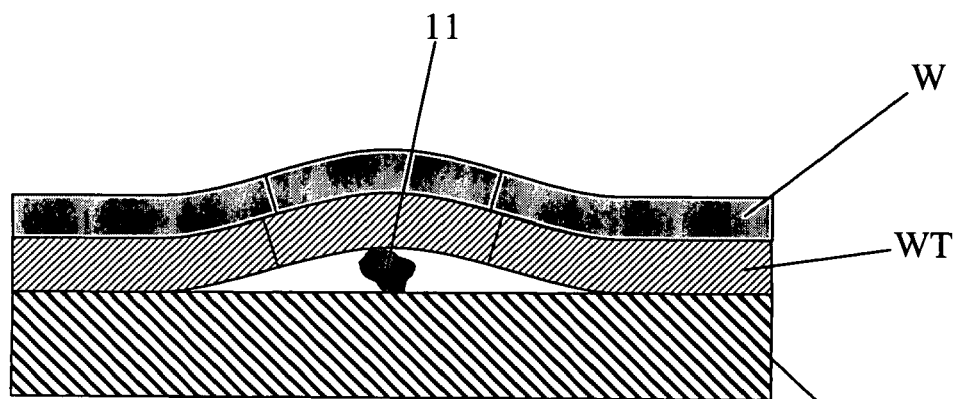
FIG. 2A depicts a method and system, in cross-section, during a first step.
Figure 2B:
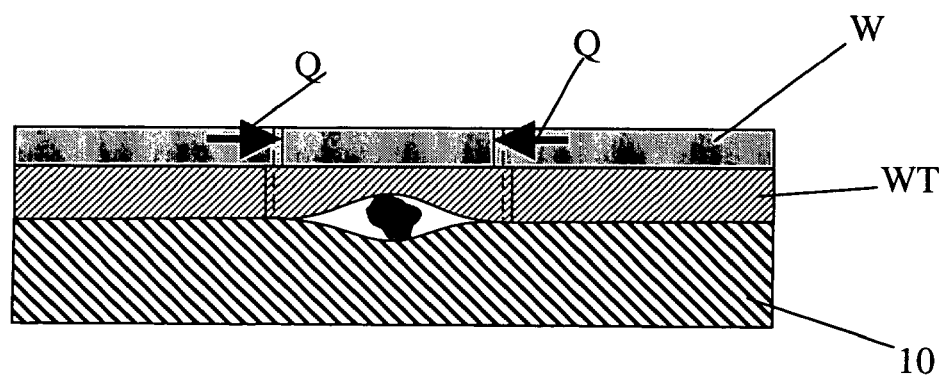
FIG. 2B depicts the method and system of FIG. 2 during a second step.

FIGS. 2A and 2B show part of a system and method, in cross-section, wherein a substrate W is being clamped to a chuck 10 (or mirror block) of the lithographic apparatus, utilizing an intermediate substrate table WT. FIG. 2A shows a situation before clamping. In that case, the substrate W is already being clamped to the substrate table WT. FIG. 2B shows, how the thus formed substrate/substrate table assembly W, WT is being clamped onto the chuck 10, for example by vacuum clamping. In an embodiment, the substrate table WT is utilized in between substrate W and chuck 10 for service and manufacturing purpose.

As is depicted in FIGS. 2A and 2B, a problem may arise when one or more contaminant particles 11 (only one shown) are present on the chuck 10, before clamping the substrate/substrate table assembly onto the chuck 10. A contaminant particle 11 can induce a warping of both the substrate W and substrate table WT (see FIG. 2A) when the substrate table WT—with substrate W already clamped thereon—is placed onto the chuck 10. Subsequently, a vacuum clamping force is applied (as in FIG. 2B) to attract the substrate table WT towards the chuck 10 to clamp the substrate table WT to the chuck 10, thus counteracting the warping and flattening of the substrate table WT. This leads to a flattening of the previously warped substrate W (compare FIGS. 2A and 2B). Since the substrate W is clamped to the substrate table WT throughout the loading process, strain is being generated in the substrate W due to the 'de-warping' of the substrate W, invoking substrate distortion and thus an error and overlay penalty during a subsequent lithography patterning step. The strain in the substrate W is indicated by arrows Q in FIG. 2B. The undesired effect, depicted in FIG. 2B, may also occur without the presence of contamination, for example in case the substrate table WT has a local unflatness or a variation in stiffness. Also or alternatively, a thermal difference between the chuck 10 and substrate table WT—prior to loading—may thermally induce deformation of the substrate table WT with respect to the chuck 10 after clamping, and thus lead to an undesired stress in the substrate W which is clamped to the substrate table WT. Also or alternatively, the loading of the substrate table WT with the substrate W to the chuck 10 may lead to a stress in the chuck 10, which might negatively influence the functioning of a sensor or a sensor part, for example an interferometer mirror connected to the chuck 10.

Figure 3A:
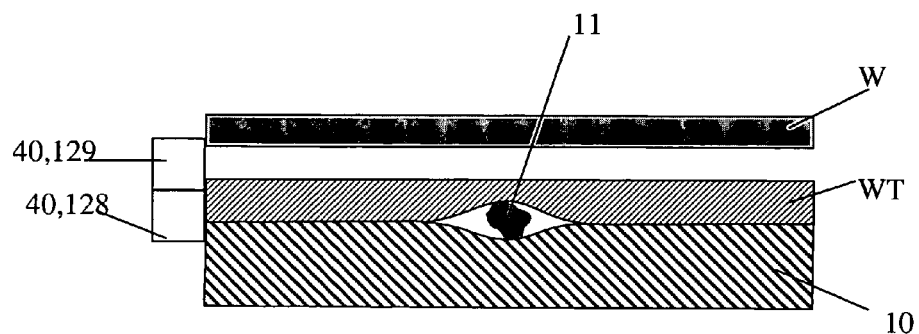
FIG. 3A depicts a system and method according to an embodiment of the invention, during a first step.
Figure 3B:
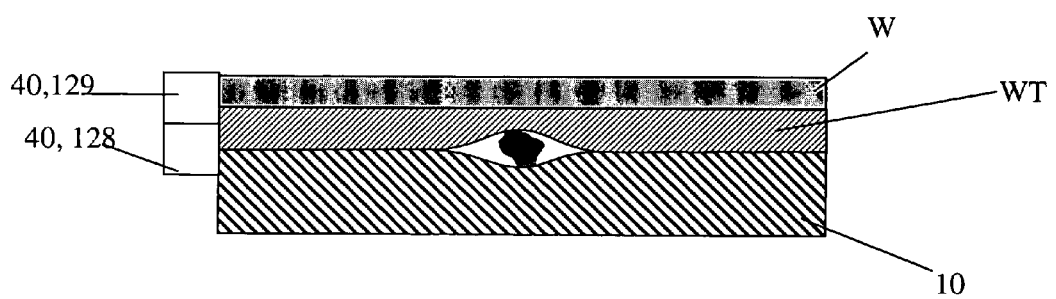
FIG. 3B depicts the embodiment of FIG. 3A, during a second step.

FIGS. 3A and 3B show, in cross-section, a non-limiting example of an embodiment of the invention. The embodiment of FIGS. 3A and 3B may be part of a lithographic apparatus, and comprises a substrate table WT constructed to subsequently hold a substrate W. Also, there is provided at least one clamping system 40, 128 which is configured to clamp the substrate table WT to a substrate table support structure, which is a chuck 10 (or mirror block) in the present embodiment. There is also provided at least one clamping system 40, 129 which is configured to clamp the substrate W to the substrate table WT after the substrate table WT has been clamped to the chuck 10, during a lithography process. Thus, the substrate table WT can be clamped to the chuck 10 independently of clamping the substrate W to the substrate table WT. In a further embodiment, the chuck 10 may be provided with one or more sensors and/or sensor mirrors, known to the skilled person, to be used to align the substrate W prior to and/or during transfer of the pattern onto the substrate W (for example in combination with the aforementioned position sensor IF, see FIG. 1).

The clamping systems 40, 128, 129 may be integrated with each other or be provided by a single clamping system, or by different clamping systems. The clamping systems 40, 128, 129 are schematically depicted in FIGS. 3A and 3B. FIGS. 4-7 provide more detailed, non-limiting, examples of the clamping system(s).

The clamping system(s) can be provided with and/or be connected to a suitable controller or processor 50, which is configured to control the clamping and release of the substrate to/from the substrate table, the controller 50 also being configured to control the independent clamping and release of the substrate table to/from the chuck. The controller can comprise suitable hardware and/or software (e.g., a computer, processor, microelectronics and other suitable controlling means) as will be clear to the person skilled in the art.

The clamping system(s) can be configured in various ways. In an embodiment, the clamping system(s) is configured to clamp the substrate table WT to the chuck 10 by vacuum clamping. In an embodiment, the clamping system(s) may be configured to independently clamp the substrate W to the substrate table WT by vacuum clamping (i.e., independently with respect to clamping the substrate table WT to the chuck 10). Alternatively or additionally, for example, one or more of the clamping systems can be configured to cooperate with the substrate W and/or substrate table WT to provide electrostatic clamping, or electromagnetic clamping, or even mechanical clamping. In an embodiment, the chuck may be provided with at least part of the clamping system(s) (see FIGS. 4, 5 and 7). In an embodiment, the substrate table WT may be provided with at least part of the clamping system(s) (see FIGS. 4-7). Vacuum, electrostatic, electromagnetic and mechanical clamping systems as such are known to the skilled person and thus not described in any further detail.

FIGS. 4-7 show non-limiting examples of an assembly, wherein the substrate table WT, WT', WT'', WT''' is a burl table, comprising a table 30 having burls 31 extending towards the chuck 10, 10' and burls 32 extending towards the substrate W during use, after positioning the burl table WT, WT', WT'', WT''' onto the chuck 10, 10' and the substrate W onto the burl table WT, WT', WT'', WT'''. The burls 31, 32 can provide a reduction of contamination sensitivity, and can provide vacuum clamping, in combination with a suitable clamping system. In the latter case, for example, two vacuum seals 25, 26 may be provided by separate parts of the substrate table WT' (see FIG. 4). For example, both seals 25, 26 may extend along the perimeter or outer edge of the burl table WT'. The seals 25, 26 may be configured to provide high flow restriction to seal a first vacuum space and second vacuum space, which spaces are between the substrate table and chuck, and the substrate table and substrate, respectively.

Figure 4:
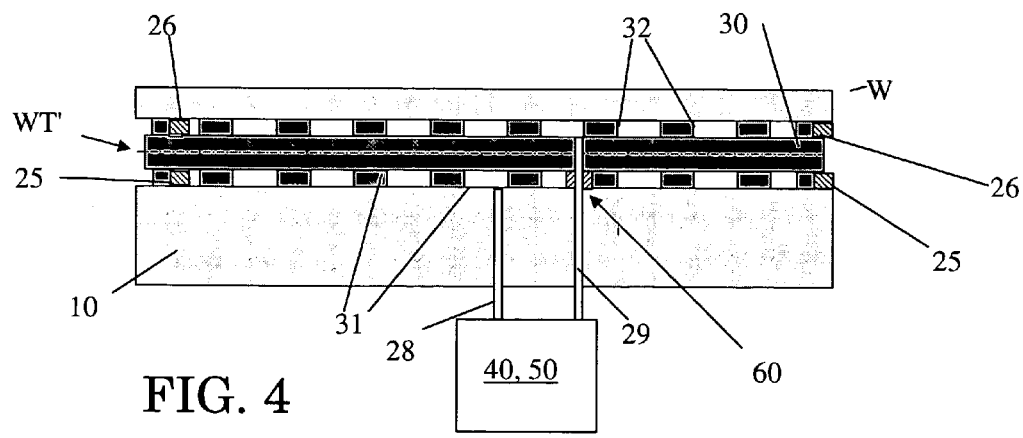
FIG. 4 depicts, in cross-section, a further embodiment.

As an example, the clamping system may simply be provided with suitable vacuum lines 28, 29 connected to one or more suitable vacuum pumps 40. The controller 50 can independently set desired vacuum clamping pressures in the vacuum lines 28, 29 at desired operating times. In the embodiment of FIG. 4, a first vacuum line 28 is provided, to apply a clamping vacuum to a first area, between the substrate table WT' and the chuck 10, to clamp the substrate table WT' to the chuck 10 during a desired operating period. Also, the clamping system may be provided with a second vacuum line 29, for example independently controllable with respect to the first vacuum line 28 by controller 50, to provide a vacuum to a second area, between the table WT' and the substrate W, to clamp the substrate W to the substrate table WT'. Vacuum seals 25, 26 of the substrate table WT provide a suitable sealing of the first and second areas (along the perimeter of the substrate table WT').

The aforementioned vacuum seals and vacuum lines may be configured in various ways, as will be clear to the skilled person. Also, for example, the substrate table WT' and chuck 10 may be designed such, that the substrate table WT' may dock onto suitable vacuum applicators and/or lines 28, 29 extending through the chuck 10 to apply respective vacuum clamping pressures to the first and second areas at a desired operating period, to provide the desired clamping. A seal 60 may be provided to bridge a gap between the chuck 10 and table part 30 of the substrate table WT', to couple the second vacuum line 29 to the second area during use (see FIG. 4) so that a respective vacuum clamping pressure—received via the second vacuum line 29—may be applied to the second area.

Figure 5:
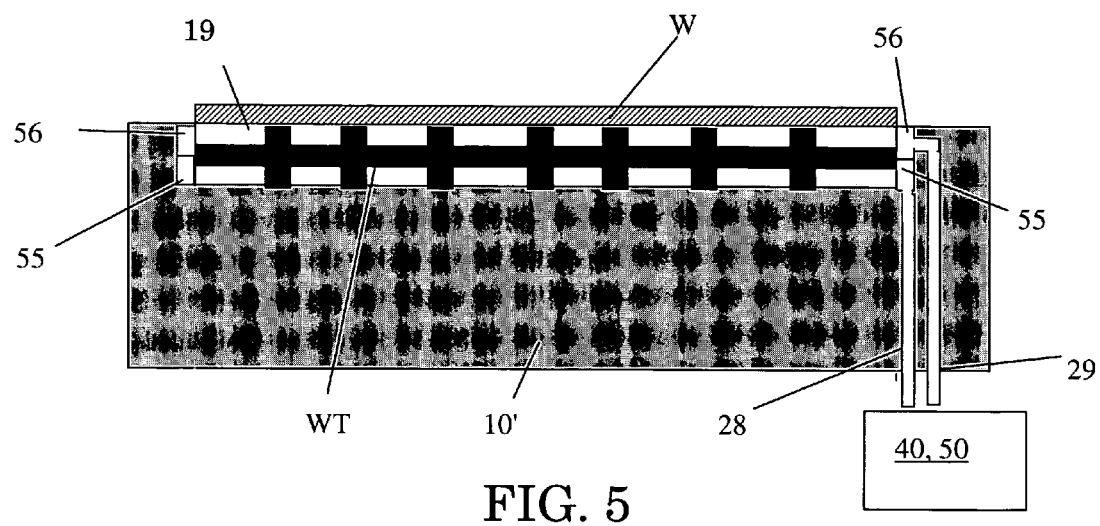
FIG. 5 depicts, in cross-section, another embodiment.

As is schematically indicated in FIG. 5, in an embodiment, the respective vacuums may also be provided via a side wall of the chuck 10', for example, via a first channel and/or groove 55 to apply a vacuum to the lower burl area extending between the substrate table WT and chuck 10', and a second channel and/or groove 56 to apply a second vacuum (independently from the first channel and/or groove) to the upper burl area extending between the substrate table WT and substrate W. For example, the chuck side wall may be the inner wall of a recess 19 in the chuck, the recess 19 being configured to receive, and surround, the substrate table WT as well as at least part of a periphery of the substrate W (see FIG. 5).

Figure 6:
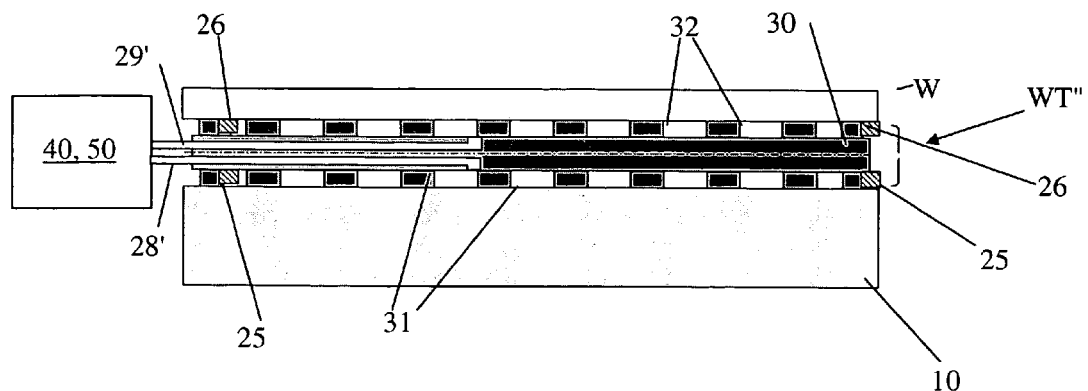
FIG. 6 depicts, in cross-section, another embodiment.
Figure 7:
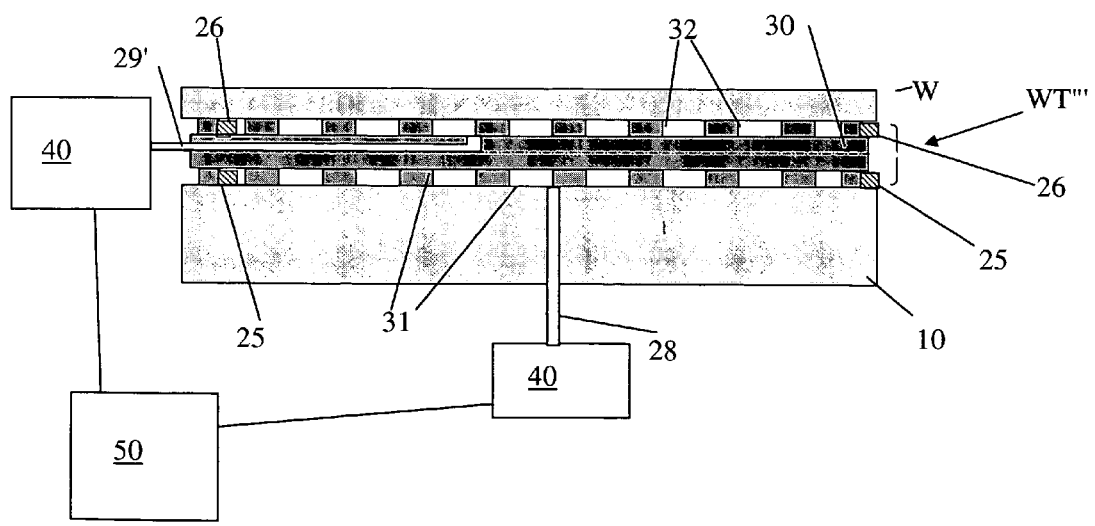
FIG. 7 depicts, in cross-section, another embodiment.

FIG. 6 shows another embodiment, which differs from the embodiment shown in FIG. 4 in that vacuum lines 28', 29' extend directly through the table part 30 of the substrate table WT", towards the respective first and second areas, and not through the chuck 10. FIG. 7 shows another embodiment, comprising two vacuum applicators or pumps 40, which can be controlled by a controller 50. In the FIG. 7 embodiment, a first vacuum line 28 extends through the chuck 10 to apply a clamping vacuum to the first area (between substrate table WT''' and chuck 10), and a second vacuum line extends directly through the substrate table WT''' to independently apply a clamping vacuum to the second area (between substrate table WT''' and substrate W).

In a further embodiment, the substrate table WT, WT', WT", WT''' and the substrate table support structure 10, 10' have different thermal expansion coefficients. Advantageously, the substrate table WT, WT', WT", WT''' may be substantially made of one or more low thermal expansion materials, which provide improved lithography performance. For example, the substrate table may be substantially made of one or more of the following materials: SiSiC, SiC, Zerodur, cordierite, $Al_2O_3$, AlN, $Si_3N_4$. Also, the substrate table may be provided with one or more coatings.

In a further embodiment, the clamping system is, or systems are, configured to release the substrate table WT, WT', WT", WT''' from the respective chuck 10, 10' in case the substrate table does not support a substrate W. Thus, stress in the chuck 10, 10' and/or substrate table WT, WT', WT", WT''', which stress relates to the clamping, can be released. Also, for example, after the release, the substrate table WT, WT', WT", WT''' may be moved away from the chuck 10, 10', for example for maintenance and/or cleaning purposes.

During use of the embodiments shown in FIGS. 3-7, a device manufacturing method can be provided, the method comprising clamping the substrate table WT to the chuck 10 prior to clamping the substrate W to the substrate table WT (see FIGS. 3A and 3B). Thus, during the clamping of the substrate table WT to the chuck 10, no substrate W is clamped onto the substrate table WT. For example, the clamping order may be controlled by the aforementioned controller 50. FIG. 3A shows a first step of clamping the substrate table WT to the chuck 10 (for example by vacuum clamping), when the substrate table WT has been positioned onto a suitable location on the chuck 10, and FIG. 3B shows the subsequent step of clamping the substrate W to the substrate table WT. In this way, particle and/or thermally induced stresses in the substrate W may be avoided, so that a subsequent transfer of a pattern (from a patterning device, see FIG. 1) to the substrate W may be carried out with improved precision.

In an embodiment, the substrate table WT is brought substantially into a thermal equilibrium with the chuck 10 prior to loading the substrate W onto the substrate table WT. Thus, a lithography error due to a thermally induced stress may be avoided.

In an embodiment, the apparatus is configured to automatically change the substrate W with a next substrate W, after having transferred the pattern from a patterning device onto the substrate W, and configured to release the substrate table WT from the substrate table support structure (e.g., chuck 10) during at least part of the step of the changing of at least one of the substrates. For example, the controller 50 may be configured to provide such a release. The release of the substrate table WT from the substrate table support structure may be temporary, such that the release is subsequently followed by clamping the substrate table WT to the substrate table support structure again, for example just before the substrate table WT receives a next substrate W to be processed, or at another suitable operating time.

In an embodiment, the substrate table WT may be released from the chuck 10 (by undoing the respective clamping) of a lithography apparatus during at least part of a time period when no pattern is being transferred onto a substrate, in the apparatus. For example, the substrate table WT may be released from the chuck 10 during a time period when the substrate table WT is not used to hold the substrate W for transfer of a pattern onto the substrate (such as during a time period when a substrate is removed for the supply of a next substrate to be patterned). The substrate table WT may be temporarily released from the chuck 10 during the exchange of each substrate for a next substrate, or during exchange of only one or some of the substrates during processing of a sequence or plurality of substrates.

The temporary release of the substrate table WT from the chuck 10 provides an advantage that the substrate table WT may be kept loose with respect to the chuck 10, for example during a certain idle time or during substrate exchange, until the substrate table WT is to be used in a lithography process to hold a substrate W. In this way, an undesired stress between the substrate table WT and the chuck 10 may be released.

An additional or alternative advantage is that a stress in the chuck 10, relating to the clamping of the substrate W and substrate table WT to the chuck 10, may be avoided. Therefore, for example, a measuring system and/or sensor which includes a component mounted on the chuck (such as a mirror of the aforementioned interferometer sensor IF) may operate with improved accuracy.

A basic idea of an embodiment of the present invention is to clamp the substrate table and one or more of the substrates after each other (in time), particularly in the case of subsequent processing of a plurality of substrates. Thus, the controller can provide a switching mechanism to clamp the substrate table first (to the chuck), and clamp the substrate next (to the substrate table). This insight may considerably improve overlay precision, particularly in the case where the substrate table and the chuck are made of different materials, or have (overall) different thermal expansion coefficients. Following from the above, the substrate table WT may be semi-continuously clamped to the chuck. For example, each substrate W may be clamped to the substrate table WT just after a clamping sequence of clamping that substrate table WT to a chuck has been completed. Certain small time periods may be provided between the clamping of the substrate table to the chuck and the clamping of the substrate to the substrate table, for example time periods of fractions of a second, or one or more seconds, or other time periods.

Also, for example, as follows from the above, the substrate table may be temporarily released and subsequently clamped again during at least part of the exchanging of each substrate W with a next substrate, but also or alternatively, for example, after every certain amount of substrates, for example a batch of substrates, or after a certain time period, etc., in the subsequent processing of a plurality of substrates.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program or above-mentioned software, containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus arranged to transfer a pattern from a patterning device onto a substrate, wherein the apparatus comprises:
   a support configured to hold a patterning device, the patterning device configured to provide a pattern to be transferred onto a substrate;
   a substrate table constructed to hold a substrate;
   a first clamping system configured to clamp the substrate table to a substrate table support structure; and
   a second clamping system configured to clamp a substrate to the substrate table after the substrate table has been clamped to the substrate table support structure,
   wherein the first clamping system is configured to release the substrate table without having a substrate clamped thereon, from the substrate table support structure but the substrate table remains supported by, but not displaced from, the substrate table support structure until a further clamping by the first clamping system of the supported substrate table without having a substrate clamped thereon, to the substrate table support structure so as to release a stress from the substrate table, the substrate table support structure, or both, arising as or while the substrate table is clamped to the substrate table support structure.

2. The apparatus of claim 1, configured to automatically change the substrate with a next substrate, after having transferred the pattern from a patterning device onto the substrate, and configured to release the substrate table from the substrate table support structure during the changing of at least one of the substrates.

3. The apparatus of claim 1, wherein the substrate table support structure is provided with at least part of the second clamping system, the at least part configured to apply a clamping force to clamp the substrate to the substrate table.

4. The apparatus of claim 1, wherein the substrate table is provided with at least part of the first clamping system, the at least part configured to apply a clamping force to clamp the substrate table to the substrate table support structure.

5. The apparatus of claim 4, wherein the at least part is an outlet configured to provide vacuum for vacuum clamping the substrate table to the substrate table support structure.

6. The apparatus of claim 1, wherein the first and second clamping systems are configured to generate a vacuum to provide vacuum clamping.

7. The apparatus of claim 1, wherein the substrate table and the substrate table support structure have different thermal expansion coefficients.

8. The apparatus of claim 1, wherein the first clamping system is configured to temporarily release the substrate table from the substrate table support structure and to clamp the substrate table to the substrate table support structure again, after the transfer of a pattern from a patterning device to every certain amount or batch of substrates.

9. The apparatus of claim 1, wherein the second clamping system has an outlet arranged at fixed position facing a side of the substrate table, the side being transverse to a surface of the substrate table onto which, in use, the substrate is clamped and the outlet configured to provide vacuum for vacuum clamping the substrate to the substrate table.

10. The apparatus of claim 9, wherein the substrate table has a passage within a body of the substrate table, the passage having an inlet configured to face or couple with the outlet.

11. A device manufacturing method, comprising:
clamping a substrate table to a support structure;
after the clamping of the substrate table to the support structure, clamping a substrate to the substrate table;
transferring a pattern from a patterning device onto the substrate; and
releasing the substrate table without having a substrate clamped thereon, from the support structure but the substrate table remains supported by, but not displaced from, the support structure until a further clamping of the supported substrate table without having a substrate clamped thereon, to the support structure so as to release a stress from the substrate table, the support structure, or both, arising as or while the substrate table is clamped to the support structure.

12. The method of claim 11, wherein the substrate table is being brought into a thermal equilibrium with the support structure prior to loading the substrate onto the substrate table.

13. The method of claim 11, comprising subsequent processing of a plurality of substrates, the processing involving transferring a pattern to each substrate of the plurality of substrates, and temporarily releasing the substrate table from the support structure at least once during the processing.

14. The method of claim 11, wherein the substrate table is being temporarily released from the support structure in case of changing the substrate with a next substrate.

15. The method of claim 11, wherein the substrate table is a burl table, clamping between the substrate table and support structure is effected by vacuum clamping, and clamping between the substrate table and substrate is effected by vacuum clamping.

16. The method of claim 11, wherein the substrate table is temporarily released from and clamped again to the support structure after the transfer of a pattern from a patterning device to every certain amount or batch of substrates.

17. A substrate table clamping apparatus, comprising:
a substrate table constructed to hold a substrate;
a first clamping system configured to clamp the substrate table to a substrate table support structure; and
a second clamping system configured to clamp a substrate to the substrate table after the substrate table has been clamped to the substrate table support structure, the second clamping system having an outlet arranged at a fixed position facing a side of the substrate table such that the outlet is not fixedly attached to the side, the side being transverse to a surface of the substrate table onto which, in use, the substrate is clamped and the outlet configured to provide vacuum for vacuum clamping the substrate to the substrate table.

18. The apparatus of claim 17, wherein the first clamping system is configured to release the substrate table from the substrate table support structure when the substrate table does not support a substrate.

19. The apparatus of claim 17, wherein the substrate table is provided with at least part of the first clamping system, the at least part configured to apply a clamping force to clamp the substrate table to the substrate table support structure.

20. The apparatus of claim 19, wherein the at least part is a vacuum outlet configured to provide vacuum for vacuum clamping the substrate table to the substrate table support structure.

21. The apparatus of claim 17, wherein the first clamping system is configured to release the substrate table from the substrate table support structure but the substrate table remains supported by, but not displaced from, the substrate table support structure until a further clamping of the supported substrate table to the substrate table support structure.

22. The apparatus of claim 17, wherein the substrate table has a passage within a body of the substrate table, the passage having an inlet configured to face or couple with the outlet.

23. The apparatus of claim 17, wherein the first clamping system has an outlet arranged to face the side of the substrate table, the outlet configured to provide vacuum for vacuum clamping the substrate table to the substrate table support structure.

* * * * *